United States Patent
Glarvey et al.

(10) Patent No.: US 10,910,525 B2
(45) Date of Patent: *Feb. 2, 2021

(54) CADMIUM-FREE QUANTUM DOT NANOPARTICLES

(71) Applicant: Nanoco Technologies Ltd., Manchester (GB)

(72) Inventors: Paul Anthony Glarvey, Stockport (GB); James Harris, Manchester (GB); Steven Daniels, Derbyshire (GB); Nigel Pickett, Manchester (GB); Arun Narayanaswamy, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/599,931

(22) Filed: Oct. 11, 2019

(65) Prior Publication Data

US 2020/0052169 A1 Feb. 13, 2020

Related U.S. Application Data

(63) Continuation of application No. 15/725,768, filed on Oct. 5, 2017, now Pat. No. 10,483,440, which is a (Continued)

(51) Int. Cl.
*H01L 33/50* (2010.01)
*B22F 1/00* (2006.01)
(Continued)

(52) U.S. Cl.
CPC .......... *H01L 33/502* (2013.01); *B01J 13/02* (2013.01); *B22F 1/0018* (2013.01); *B22F 1/02* (2013.01); *B22F 9/24* (2013.01); *C01B 25/088* (2013.01); *C09B 67/0097* (2013.01); *C09C 3/063* (2013.01); *C09K 11/62* (2013.01);
(Continued)

(58) Field of Classification Search
CPC ...... H01L 33/502; H01L 33/005; B01J 13/02; B22F 1/0018; B22F 1/02; B22F 9/24; C01B 25/088; C09B 67/0097; C09C 3/063; C09K 11/62; C09K 11/623; C09K 11/64; C09K 11/70
See application file for complete search history.

(56) References Cited

U.S. PATENT DOCUMENTS

| | | | | |
|---|---|---|---|---|
| 2006/0157720 A1* | 7/2006 | Bawendi | ............... | C09K 11/565 257/98 |
| 2013/0190493 A1* | 7/2013 | Naasani | ............... | C09K 11/025 544/200 |
| 2014/0302627 A1* | 10/2014 | Ko | .................. | H01L 51/502 438/35 |

* cited by examiner

*Primary Examiner* — Syed I Gheyas
(74) *Attorney, Agent, or Firm* — Blank Rome, LLP

(57) ABSTRACT

Quantum dot semiconductor nanoparticle compositions that incorporate ions such as zinc, aluminum, calcium, or magnesium into the quantum dot core have been found to be more stable to Ostwald ripening. A core-shell quantum dot may have a core of a semiconductor material that includes indium, magnesium, and phosphorus ions. Ions such as zinc, calcium, and/or aluminum may be included in addition to, or in place of, magnesium. The core may further include other ions, such as selenium, and/or sulfur. The core may be coated with one (or more) shells of semiconductor material. Example shell semiconductor materials include semiconductors containing zinc, sulfur, selenium, iron and/or oxygen ions.

15 Claims, 2 Drawing Sheets

Related U.S. Application Data continuation of application No. 14/579,237, filed on Dec. 22, 2014, now Pat. No. 9,853,190.

(60) Provisional application No. 61/924,031, filed on Jan. 6, 2014.

(51) Int. Cl.
*B22F 9/24* (2006.01)
*C09C 3/06* (2006.01)
*C09K 11/62* (2006.01)
*B22F 1/02* (2006.01)
*B01J 13/02* (2006.01)
*C09K 11/64* (2006.01)
*C09K 11/70* (2006.01)
*C01B 25/08* (2006.01)
*H01L 33/00* (2010.01)
*C09B 67/02* (2006.01)
*B82Y 20/00* (2011.01)
*B82Y 40/00* (2011.01)

(52) U.S. Cl.
CPC ............ *C09K 11/623* (2013.01); *C09K 11/64* (2013.01); *C09K 11/70* (2013.01); *H01L 33/005* (2013.01); *B82Y 20/00* (2013.01); *B82Y 40/00* (2013.01); *C01P 2002/84* (2013.01); *C01P 2004/64* (2013.01); *C01P 2006/40* (2013.01); *C01P 2006/60* (2013.01); *H01L 2933/0041* (2013.01); *Y10S 977/774* (2013.01); *Y10S 977/892* (2013.01)

CADMIUM-FREE QUANTUM DOT NANOPARTICLES

CROSS-REFERENCE TO RELATED APPLICATIONS

This application is a continuation of U.S. patent application Ser. No. 15/725,768 filed on Oct. 5, 2017, which is a continuation of U.S. patent application Ser. No. 14/579,237 filed on Dec. 22, 2014, which issued on Dec. 26, 2017 as U.S. Pat. No. 9,853,190, which claims the benefit of U.S. Provisional Application No. 61/924,031 filed on Jan. 6, 2014. The entire disclosures of each of these applications are hereby incorporated by reference as if set forth herein in their entirety.

BACKGROUND OF THE INVENTION

1. Field of the Invention

The present invention generally relates to quantum dot nanoparticles. More particularly, it relates to the synthesis of quantum dot nanoparticles containing no cadmium or other heavy metals.

2. Description of the Related Art Including Information Disclosed Under 37 CFR 1.97 and 1.98

There has been substantial interest in the preparation and characterization of compound semiconductor particles with dimensions in the order of 2-100 nm, often referred to as quantum dots (QDs) and/or nanocrystals. This interest is mainly due to their size-tunable electronic, optical and chemical properties. For example, many QDs display relatively strong emission in the visible region of the electromagnetic spectrum. Moreover, the wavelength of light absorbed and emitted is a function of the size of the QD. Because of their unique optical properties, QDs are promising materials for commercial applications as diverse as biological labeling, solar cells, catalysis, biological imaging, and light-emitting diodes to name just a few.

To date, the most studied and prepared of semiconductor materials have been the Group II-VI materials, namely, ZnS, ZnSe, CdS, CdSe, CdTe; most noticeably CdSe due to its tunability over the visible region of the spectrum. Semiconductor nanoparticles are of academic and commercial interest due to their properties, which are unique from the properties of the corresponding crystalline bulk forms of the same semiconductor materials. Two fundamental factors, both related to the size of the individual nanoparticles, are responsible for their unique properties. The first is the large surface-to-volume ratio. As a particle becomes smaller, the ratio of the number of surface atoms to those in the interior increases. This leads to the surface properties playing an important role in the overall properties of small particles. The second factor is that, with semiconductor nanoparticles, there is a change in the electronic properties of the material with the size of the particle. Specifically, the band gap gradually becomes wider as the size of the particle decreases. This change in band gap is because of quantum confinement effects. This effect is a consequence of the confinement of an "electron in a box" giving rise to discrete energy levels similar to those observed in atoms and molecules, rather than a continuous band as in the corresponding bulk semiconductor material. Thus, for a semiconductor nanoparticle, the "electron and hole" produced by the absorption of a photon are closer together than in the corresponding macrocrystalline material, resulting in non-negligible Coulombic interaction between the electron and hole. This leads to a narrow bandwidth emission that is dependent upon the particle size and composition. Consequently, quantum dots have higher kinetic energy than the corresponding macrocrystalline material and the first excitonic transition (band gap) increases in energy with decreasing particle diameter. Thus, quantum dots with a smaller diameter absorb and emit light of higher energy than do quantum dots with a larger diameter. In other words, the color of light absorbed and emitted can be "tuned" as a function of the particle diameter.

Single-core nanoparticles, which consist of a single semiconductor material (typically along with an outer organic passivating layer), tend to have relatively low quantum efficiencies due to electron-hole recombination occurring at defects and dangling bonds situated on the nanoparticle surface that lead to non-radiative electron-hole recombinations. One method of eliminating defects and dangling bonds is to grow a shell comprised of a second semiconductor material having a wider band-gap on the surface of the core particle to produce a "core-shell particle". The shell semiconductor material preferably has a small lattice mismatch with the core material so that the interface between the two materials is minimized. Core-shell particles separate charge carriers confined in the core from surface states that would otherwise act as non-radiative recombination centers. A common example is ZnS grown on the surface of CdSe cores. Excessive strain can further result in defects and non-radiative electron-hole recombination resulting in low quantum efficiencies.

The coordination about the outer inorganic surface atoms is incomplete, with highly reactive "dangling bonds" on the surface, which can lead to particle agglomeration. This problem can be partially overcome by passivating (capping) the "bare" surface atoms with protecting organic groups. The capping or passivating of particles not only prevents particle agglomeration from occurring, it also protects the particle from its surrounding chemical environment and provides electronic stabilization (passivation) to the particles. The capping agent usually takes the form of a Lewis base compound covalently bound to surface metal atoms of the outer most inorganic layer of the particle.

Several synthetic methods for the preparation of semiconductor nanoparticles have been reported. Early routes applied conventional colloidal aqueous chemistry, while more recent methods involve the kinetically controlled precipitation of nanocrystallites, using organometallic compounds.

Since the optical properties of QDs are size-dependent, it is often desirable to produce populations of QDs with a high degree of monodispersity, i.e., with a high degree of uniformity in the size of the QDs in the population. Also, populations of QDs with high quantum yield (QY, the ratio of photons emitted to photons absorbed) are desirable. Methods have been reported to produce semiconductor QDs with high monodispersity and with quantum yields greater than 50%. Most of these methods are based on the original "nucleation and growth" method described by Murray, Norris and M. G. Bawendi, *J. Am. Chem. Soc.* 1993, 115, 8706, incorporated by reference in its entirety, but use other precursors than the organometallic ones used. Murray et al originally used organometallic solutions of metal-alkyls ($R_2M$) M=Cd, Zn, Te; R=Me, Et and tri-n-octylphosphine sulfide/selenide (TOPS/Se) dissolved in tri-n-octylphosphine (TOP). These precursor solutions are injected into hot tri-n-octylphosphine oxide (TOPO) in the temperature range 120-400° C. depending on the material being produced. This produces TOPO-coated/capped semiconductor nanoparticles of Group II-VI material. The size of the particles is controlled by the temperature, concentration of precursor used and length of time at which the synthesis is undertaken, with larger particles being obtained at higher temperatures, higher precursor concentrations and prolonged reaction times. This organometallic route has advantages over other synthetic methods, including near monodispersity and high particle crystallinity.

Cadmium and other restricted heavy metals used in conventional QDs are highly toxic elements and represent a major concern in commercial applications. The inherent toxicity of cadmium-containing QDs precludes their use in applications involving animals or humans. For example, recent studies suggest that QDs made of a cadmium chalcogenide semiconductor material can be cytotoxic in a biological environment unless protected. Specifically, oxidation or chemical attack through a variety of pathways can lead to the formation of cadmium ions on the QD surface that can be released into the surrounding environment. Although surface coatings such as ZnS can significantly reduce the toxicity, it may not completely eliminate it because QDs can be retained in cells or accumulated in the body for a long period of time, during which their coatings may undergo some form of degradation exposing the cadmium-rich core.

The toxicity affects not only the progress of biological applications but also other applications including optoelectronic and communication because heavy metal-based materials are widespread in many commercial products including household appliances such as IT and telecommunication equipment, lighting equipment, electrical and electronic tools, toys, leisure and sports equipment. A legislation to restrict or ban certain heavy metals in commercial products has been already implemented in many jurisdictions throughout the world. For example, European Union directive 2002/95/EC, known as the "Restrictions on the use of Hazardous Substances in electronic equipment" (or RoHS), bans the sale of new electrical and electronic equipment containing more than certain levels of lead, cadmium, mercury, hexavalent chromium along with polybrominated biphenyl (PBB) and polybrominated diphenyl ether (PBDE) flame retardants. This law requires manufacturers to find alternative materials and develop new engineering processes for the creation of common electronic equipment. In addition, on 1 Jun. 2007 a European Community Regulation came into force concerning chemicals and their safe use (EC 1907/2006). The Regulation concerns the Registration, Evaluation, Authorization and Restriction of Chemical substances and is known as "REACH". The REACH Regulation imposes greater responsibility on industry to manage the risks associated with chemicals and to provide safety information on the substances. It is anticipated that similar regulations will be promulgated worldwide including China, Korea, Japan and the US. Thus, there are significant economic incentives to develop alternatives to Group II-VI QD materials.

Due to their increased covalent nature, Group III-V and Group IV-VI highly crystalline semiconductor nanoparticles are more difficult to prepare and much longer annealing times are usually required. However, there are now reports of Group III-VI and Group IV-VI materials being prepared in a similar manner to that used for the Group II-VI materials. Examples of such Group III-VI and Group IV-VI materials include GaN, GaP, GaAs, InP, InAs and for PbS and PbSe.

For all of the above methods, rapid particle nucleation followed by slow particle growth is essential for a narrow particle size distribution. All these synthetic methods are based on the original organometallic "nucleation and growth" method by Murray et al., which involves the rapid injection of the precursors into a hot solution of a Lewis base coordinating solvent (capping agent) which may also contain one of the precursors. The addition of the cooler solution subsequently lowers the reaction temperature and assists particle growth but inhibits further nucleation. The temperature is then maintained for a period of time, with the size of the resulting particles depending on reaction time, temperature and the ratio of capping agent to the precursor used. The resulting solution is cooled, followed by the addition of an excess of a polar solvent (methanol or ethanol or sometimes acetone) to produce a precipitate of the particles that can be isolated by filtration or centrifugation. Generally, larger particles precipitate more easily than smaller particles. Thus, precipitation provides a means of separating the quantum dots as a function of their size. Multiple precipitation steps are usually required to achieve narrow particle size distributions.

Fundamentally, these prior art preparations rely on the principle of particle nucleation followed by growth. Moreover, to have a mono-dispersed ensemble of nanoparticles there is preferably proper separation of nanoparticle nucleation from nanoparticle growth with the later occurring at a lower temperature from the former. This is achieved by rapid injection of one or both precursors into a hot coordinating solvent (containing the other precursor if otherwise not present), which initiates particle nucleation. The sudden addition of the cooler solution upon injection subsequently lowers the reaction temperature (the volume of solution added is typically about ⅓ of the total solution) and inhibits further nucleation maintaining a narrow nanoparticle size distribution. This method may work well for small-scale synthesis where one solution can be added rapidly to another while keeping a homogenous temperature throughout the reaction. However, on larger preparative scales, wherein large volumes of solution are required to be rapidly injected into one another, temperature differentials can occur within the reaction, which can lead to a large particle size distribution. Moreover, the need to perform multiple, size-selective, purification steps is not practical for the production of large quantities of QDs.

U.S. Pat. Nos. 7,588,828, 7,803,423, 7,985,446, and 8,062,703 (referred to herein collectively as "the seeding patents") disclose synthetic methods for preparing monodisperse QD populations that do not rely on the hot injection methods and the size-selective purification steps described above. The disclosures of each of these patents are hereby incorporated by reference in their entireties. Briefly, the methods disclosed in these patents involve the use of a molecular cluster "seed" compound that serves as a template for the nucleation of the QD semiconductor material in solution. The cluster compound acts as a seed or nucleation point upon which nanoparticle growth can be initiated. In this way, a high temperature nucleation step is not necessary to initiate nanoparticle growth because suitable nucleation sites are already provided in the system by the molecular clusters. By providing nucleation sites that are more uniform than the nucleation sites employed in the methods described above, the synthesis provides a population of QDs that are essentially monodisperse. A significant advantage of the molecular seeding method is that it can be easily scaled-up.

The seeding methods described in the seeding patents can be used to make Group II-VI QDs and can also be used to make Group III-V and Group IV-VI QDs. But as mentioned above, the Group III-V and Group IV-VI QDs can be difficult to work with. Because of the high surface area-to-volume ratio, atoms on the surface of small QDs tend to diffuse from the surface of the smaller particles to the surface of the larger particles, a process known as Ostwald ripening. QDs of Group III-V materials such as InP and alloys thereof tend to be particularly unstable due to Ostwald ripening. Because Ostwald ripening decomposes the smaller QDs and promotes the growth of larger QDs, this process makes it difficult to obtain QDs that emit at shorter wavelengths, i.e., that emit in the blue and green regions of the visible spectrum.

There is thus a need in the art for improved synthetic methods of producing cadmium-free QDs that emit the shorter wavelengths of visible light.

BRIEF SUMMARY OF THE INVENTION

The methods and compositions disclosed herein overcome the problems described above by providing a heavy metal-free QD material that emits light in the green region of the spectrum but that is more stable to Ostwald ripening than the InP-based QDs known in the art. The QD compositions are obtained by incorporating ions such as zinc, aluminum, or magnesium into the QD core.

The foregoing summary is not intended to summarize each potential embodiment or every aspect of the present disclosure.

BRIEF DESCRIPTION OF THE SEVERAL VIEWS OF THE DRAWING(S)

DETAILED DESCRIPTION OF THE INVENTION

Figure 1:
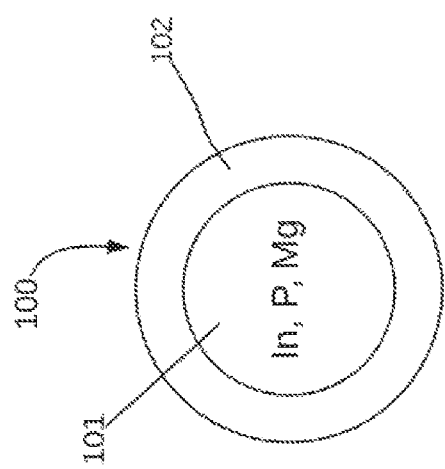
FIG. 1 is a schematic, cross-sectional view of a core-shell QD having a core that includes indium, magnesium, and phosphorus ions.

FIG. 1 illustrates a core-shell QD 100 having a core 101 of a semiconductor material that includes indium, magnesium, and phosphorus ions. Ions such as zinc and/or aluminum may be included in addition to, or in place of, magnesium. The core may further include other ions, such as selenium, and/or sulfur. The core 101 is coated with one (or more) shells of semiconductor material. The shell semiconductor material(s) may be essentially any semiconductor material known in the art as a shell material for QDs. Example shell semiconductor materials include semiconductors containing zinc, sulfur, selenium, iron and/or oxygen ions.

While FIG. 1 illustrates a distinct boundary between core 101 and shell 102, it should be appreciated that such a distinct boundary may not exist. Instead, there may be appreciable alloying between the core and shell materials such that there is a gradient of materials at the boundary as the core material transitions to the material of the innermost shell. Likewise, if the QD contains multiple shells, significant alloying may occur at the boundaries between shells. It will also be appreciated that the outermost surface of QD 100 is most likely coated with capping ligands, as discussed in the Description of the Related Art section, above.

As explained above, incorporating magnesium into the InP-based core provides bulk to the semiconductor core without significantly altering its band structure. Therefore, the stability of the core material is enhanced due to a lower surface/volume ratio, but the optical properties (i.e., absorption/emission) still correspond to that of a smaller InP core.

Generally, any method described in the art for synthesizing InP-based QDs can be adapted to incorporate magnesium into the semiconductor material. One particularly suitable method for synthesizing an InP-based core is the molecular seeding method described in the seeding patents, referenced above. Briefly, the method involves reacting core material precursors in the presence of a molecular seeding compound, as illustrated in step 201 of FIG. 2. Suitable precursor compounds for an InP-based core must provide a source of indium and a source of phosphorus. For example, the indium source may be indium myristate and the phosphorus source may be tris(trimethylsilyl)phosphine. It will be appreciated that other indium and phosphorus sources may be used.

Further, a magnesium source is required to incorporate magnesium into the InP-based core. A suitable magnesium source is magnesium myristate.

The core-forming reaction may be conducted in the presence of a molecular seeding compound. Suitable molecular seeding compounds are described at length in the co-owned patents referenced above. One example of a suitable molecular seeding compound is the zinc sulfide-based molecular seeding compound described in U.S. Pat. No. 8,062,703 (the entire contents of which are incorporated by reference).

The core precursor compounds and the molecular seeding compound are heated in a solvent under conditions described in the seeding patents and in U.S. Patent Publication No. 2010/0068522, filed Aug. 7, 2009, the entire contents of which are hereby incorporated by reference. Generally, a non-electron donating solvent is used for the reaction. One example of an appropriate solvent is THERMINOL® 66 heat transfer fluid (Solutia, Inc., St. Louis, Mo. 63141) which comprises a hydrogenated terphenyl.

Figure 2:
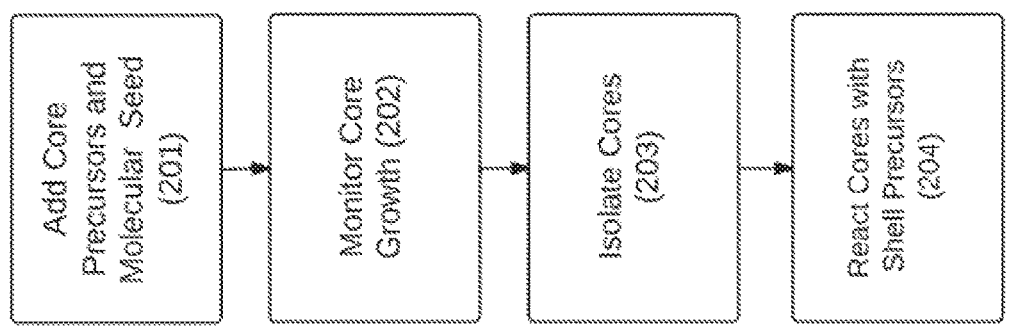
FIG. 2 is a simplified flow chart illustrating the synthesis of a core-shell QD having a core including indium, magnesium, and phosphorus ions.

As illustrated in FIG. 2, it may be desirable to monitor an optical property 202 of the QD core during the synthesis of the core. For example, the absorbance spectrum may be monitored as the QD core grows and the reaction may be stopped when the core reaches the proper size to yield the desired absorbance and/or emission spectrum. Once the desirable optical value is obtained and the reaction stopped, the cores can be isolated 203, for example, by filtration. It may be desirable to add a non-solvent to the reaction mixture to induce precipitation of the cores. Once the cores are isolated, they may be reacted with shell precursors 204 to grow one or more semiconductor shells on the cores. It may be desirable to pretreat the cores, for example, by etching a small amount of the material from the core, prior to reacting the core with the shell precursors. An acid, such as hydrofluoric acid may be used to etch the core.

The following examples illustrate representative embodiments of processes for preparing QDs, as disclosed herein.

EXAMPLES

Example 1: Magnesium-Containing Cores

Figure 3:
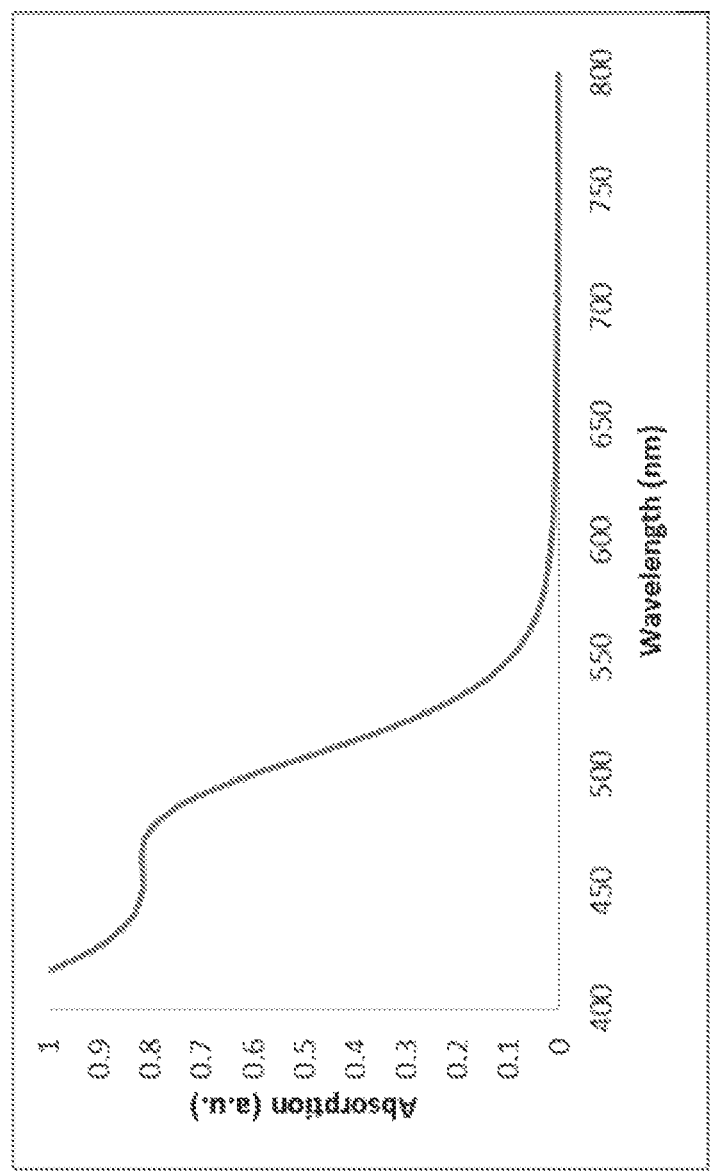
FIG. 3 is the absorption spectrum of a core QD containing indium, magnesium, and phosphorus ions.

Magnesium myristate was prepared by heating magnesium acetate tetrahydrate (2.92 g) and myristic acid (12.4 g)

to 110° C. under vacuum until the solution went clear and no further liquid was evolved. This magnesium myristate was used as prepared in the following synthesis: Indium myristate (4.55 g), magnesium myristate (2.33 mL), myristic acid (0.76 g), and Therminol 66 (50 mL) were placed in a dried 250 mL round bottomed flask equipped with an air condenser, nitrogen inlet, suba seal, thermocouple, and stirrer bar and degassed under vacuum at 100° C. for 1 hour. The reaction was then placed under a nitrogen atmosphere and zinc sulfide cluster (1.35 g, prepared as described in U.S. Pat. No. 8,062,703) was added. The reaction was then degassed under vacuum for a further ½ hour and then placed under a nitrogen atmosphere. A solution of tris(trimethylsilyl)phosphine (1 M in diphenyl ether) was added dropwise in portions whilst increasing the temperature as follows: at 100° C. 2.25 mL were added, at 160° C. 3 mL were added, and at 230° C. 4 mL were added. The reaction was held at this temperature for 24 hours and then allowed to cool to room temperature. It was then subsequently reheated to 300° C. for ½ hour before cooling to room temperature. The absorption spectrum of the resulting InP-based core containing magnesium is illustrated in FIG. 3.

The reaction solution was diluted with chloroform (100 mL) and photo-etched with hydrofluoric acid over a period of 26 hours. The etched nanoparticles were isolated by the addition of methanol.

The etched cores thus obtained were then overcoated with a zinc sulfide shell followed by a zinc oxide shell as follows: Etched cores (0.2 g), Therminol 66 (20 mL), and dibutyl sebacate (20 mL) were placed in a dried 250 mL round bottomed flask equipped with an air condenser, nitrogen inlet, suba seal, thermocouple, and stirrer bar and degassed under vacuum at 80° C. for 1 hour. The reaction was then placed under a nitrogen atmosphere and zinc acetate (4.12 g) was added. The reaction was then degassed under vacuum for a further ½ hour and then placed under a nitrogen atmosphere. The reaction was heated to 210° C., held for 2 hours, heated to 230° C., dodecanethiol (2.6 mL) was added, and the reaction held for 1 hour. After this time, the temperature was lowered to 180° C., octanol (1.7 mL) added, the reaction held for ½ hour, and cooled to 60° C. The product was isolated by addition of acetone (40 mL), separated by centrifuge (4000 rpm, 3 minutes), and then washed with methanol and dissolved in toluene. The optical properties of the resultant nanoparticles were: emission maximum 523 nm, FWHM 57 nm, and quantum yield 74%.

Example 2: Zinc and Magnesium-Containing Cores

Indium myristate (11.74 g), zinc acetate (0.734 g), magnesium stearate (0.591 g), and myristic acid (1.507 g) were stirred in 100 mL of Therminol 66 and heated to 100° C. under vacuum for 2 hrs. The reaction was back-filled with nitrogen then zinc sulfide cluster (2.7 g, prepared as described in U.S. Pat. No. 8,062,703) was added. The reaction was again placed under vacuum for 30 minutes before back-filling again with nitrogen and then adding 1.2 mL dodecanethiol. Tris(trimethylsilyl) phosphine (18.5 mmol, 1M solution in diphenylether) was added at a rate of 7.2 m L/hour and the reaction mixture was heated to 195° C. and allowed to anneal for 140 hours. The core nanoparticles had an absorption feature in the UV-Vis with a peak max of 451 nm.

The reaction solution was diluted with chloroform (240 mL) and photo-etched with hydrofluoric acid until an aliquot of the solution had an emission peak max at 504 nm. The etched nanoparticles were isolated by the addition of methanol.

The etched cores thus obtained were then overcoated as follows: Etched cores (0.5 g), Therminol 66 (40 mL), zinc acetate (2.4 g) and zinc stearate (5.3 g), were placed in a dried 250 mL round-bottomed flask equipped with an air condenser, nitrogen inlet, suba seal, thermocouple, and stirrer bar and degassed under vacuum at 100° C. for 1 hour. The reaction was then placed under a nitrogen atmosphere and the reaction was heated to 215° C., held for 30 minutes, heated to 230° C., held for 25 minutes (an aliquot had a PL peak max of 509 nm), then dodecanethiol (2.5 mL) was added, and the reaction held for 50 minutes until an aliquot of reaction solution had a PL emission peak max of 517 nm. After this time, the temperature was lowered to 180° C., octanol (2.4 mL) added, the reaction held for ½ hour, and cooled to 60° C. The product was isolated by addition of acetone, separated by centrifugation (4000 rpm, 3 minutes), and then washed with methanol and dissolved in toluene. The optical properties of the resultant nanoparticles were: PL emission peak maximum 521 nm, FWHM 48 nm, and quantum yield 75%.

Example 3: Zinc and Aluminum-Containing Cores

Indium myristate (46.96 g), zinc acetate (2.936 g), aluminum stearate (3.508 g), and myristic acid (6.04 g) were stirred in 400 mL of Therminol 66 and heated to 100° C. under vacuum for 3 hours. The reaction was backfilled with nitrogen then zinc sulfide cluster (10.8 g, prepared as described in U.S. Pat. No. 8,062,703) was added. The reaction was again placed under vacuum for 30 minutes before backfilling again with nitrogen followed by 4.8 mL dodecanethiol. Tris (trimethylsilyl) phosphine (74 mmol, 1M solution in diphenylether) was added at a rate of 28.8 mL/hour and the reaction mixture was heated to 230° C. and allowed to anneal for 96 hours. The core nanoparticles had an absorption feature in the UV-Vis with a peak max of 458 nm.

A quarter of the reaction solution was diluted with chloroform (240 mL) and photo-etched with hydrofluoric acid until the solution had an PL emission peak max at 509 nm. The etched nanoparticles were isolated by the addition of methanol.

The etched cores thus obtained were then overcoated with a ZnS shell followed by a ZnO shell as follows: Etched cores (0.5 g), Therminol 66 (40 mL), zinc acetate (2.4 g) and zinc stearate (5.3 g), were placed in a dried 250 mL round bottomed flask equipped with an air condenser, nitrogen inlet, suba seal, thermocouple, and stirrer bar and degassed under vacuum at 100° C. for 1 hour. The reaction was then placed under a nitrogen atmosphere and the reaction was heated to 215° C., held for 30 minutes, heated to 230° C., held for 25 minutes (an aliquot had a PL emission peak max of 512 nm), then dodecanethiol (2.5 mL) was added, and the reaction held for 40 minutes until an aliquot of reaction solution had a PL emission max peak of 521 nm. After this time, the temperature was lowered to 180° C., octanol (2.4 mL) added, the reaction held for ½ hour, and cooled to 60° C. The product was isolated by addition of acetone, separated by centrifugation (4000 rpm, 3 minutes), and then washed with methanol and dissolved in toluene. The optical properties of the resultant nanoparticles were: PL emission peak maximum 526 nm, FWHM 47 nm, and quantum yield 82%.

Example 4: Zinc-Containing Cores

Indium myristate (11.74 g), zinc acetate (0.734 g) and myristic acid (1.507 g) were stirred in 100 mL of Therminol 66 and heated to 100° C. under vacuum for 2 hrs. The reaction was backfilled with nitrogen then zinc sulfide cluster (2.7 g, prepared as described in U.S. Pat. No. 8,062,703) was added. The reaction was again placed under vacuum for 30 minutes before backfilling again with nitrogen and then adding 0.96 mL dodecanethiol. 4.5 mL Tris (trimethylsilyl) phosphine (18.5 mmol, 1M solution in diphenylether) was added at a rate of 7.2 mL/hour then the temperature was raised to 160° C., a further 6 mL TMSP solution was added at 7.2 mL/hour and then the temperature raised to 195° C. where 8 mL more TMSP was added at 7.2 mL/hour and then allowed to anneal for 140 hours. An aliquot of the reaction mixture had an absorption feature in the UV-Vis with a peak max of 455 nm.

Half the reaction solution was diluted with chloroform (120 mL) and photo-etched with hydrofluoric acid until an aliquot of the solution had a PL emission peak max at 508 nm. The etched nanoparticles were isolated by the addition of methanol.

The etched cores thus obtained were then overcoated with a ZnS shell followed by a ZnO shell as follows: Etched cores (0.25 g), Therminol 66 (20 mL), dibutyl sebacate (20 mL) zinc acetate (2.4 g) and zinc stearate (5.3 g) and myristic acid (0.75 g) were placed in a dried 250 mL round-bottomed flask equipped with an air condenser, nitrogen inlet, suba seal, thermocouple, and stirrer bar and degassed under vacuum at 100° C. for 1 hour. The reaction was then placed under a nitrogen atmosphere and the reaction was heated to 215° C., held for 1 hour, heated to 230° C., held for 1 hour, then dodecanethiol (2.5 mL) was added, and the reaction held for 90 minutes. After this time, the temperature was lowered to 180° C., octanol (2.4 mL) added, the reaction held for ½ hour, and cooled to 60° C. The product was isolated by addition of acetone, separated by centrifugation (4000 rpm, 3 minutes), and then washed with methanol and dissolved in toluene. The optical properties of the resultant nanoparticles were: PL emission peak maximum 516 nm, FWHM 47 nm, and quantum yield 78%.

Example 5: Zinc and Calcium-Containing Cores

Indium myristate (11.74 g), zinc acetate (0.734 g), calcium stearate (0.607 g), and myristic acid (1.507 g) were stirred in 100 mL of Therminol 66 and heated under vacuum to 100° C. The reaction was backfilled with nitrogen then zinc sulfide cluster (2.7 g, prepared as described in U.S. Pat. No. 8,062,703) was added. The reaction was again placed under vacuum for 30 minutes before backfilling again with nitrogen and then adding 1.2 mL dodecanethiol. Tris(trimethylsilyl) phosphine (18.5 mmol, 1M in therminol/diphenylether 50:50 v/v mix) was added at a rate of 7.2 mL/hour and the reaction mixture was heated to 250° C., a flow of nitrogen at a rate of 0.4 L/min was passed over the reaction and allowed to anneal for 40 hours whereby the UV-Vis had an absorption feature with a peak max of 461 nm.

The reaction solution was diluted with chloroform (270 mL) and photo-etched with hydrofluoric acid until an aliquot of the solution had an emission peak max at 508 nm. The etched nanoparticles were isolated by the addition of methanol.

The etched cores thus obtained were then overcoated with a compositionally graded alloyed $ZnSe_{1-x}S_x$ shell (where $0 \leq x \leq 1$, and x increases from 0 to 1 from the core to outer surface of the shell) followed by a ZnO shell as follows: Etched cores (0.5 g inorganic mass), Therminol 66 (40 mL), zinc acetate (9.495 g) and zinc stearate (5.4 g) and calcium stearate (0.13 g) were placed in a dried 250 mL round-bottomed flask equipped with an air condenser, nitrogen inlet, suba seal, thermocouple, and stirrer bar and degassed under vacuum at 100° C. for 1 hour. The reaction was then placed under a nitrogen atmosphere and the reaction was heated to 250° C., held for 100 minutes until an aliquot of the reaction solution had a PL peak max of 508 nm. The reaction was cooled to 230° C. then a TOPSe solution (selenium powder dissolved in trioctylphosphine, 4.34 mL, 1M) was added by syringe pump over 1 hour at the same time as adding dodecanethiol (4.26 mL) over 90 minutes and once added left for a further 30 minutes. After this time, the temperature was lowered to 180° C., octanol (4.73 mL) was added by syringe pump over 1 hour. Then the reaction was cooled to 100° C., 40 mL toluene added then the product was isolated by addition of 90 mL acetone, the solid obtained by centrifuge (4000 rpm, 3 minutes) was discarded and a further 100 mL acetone was added to the supernatant. The solid obtained by centrifuge (4000 rpm, 3 minutes) was kept and then washed with acetone again and dissolved in toluene. The optical properties of the resultant nanoparticles were: $PL_{max}$=528 nm, FWHM=46 nm, and PLQY=83%.

The foregoing description of preferred and other embodiments is not intended to limit or restrict the scope or applicability of the inventive concepts conceived by the Applicants. It will be appreciated that, with the benefit of the present disclosure, features described above in accordance with any embodiment or aspect of the disclosed subject matter can be utilized, either alone or in combination, with any other described feature, in any other embodiment or aspect of the disclosed subject matter. Those skilled in the art will understand that various changes and modifications may be made without departing from the scope of the present invention as literally and equivalently covered by the following claims.

What is claimed is:

1. A quantum dot nanoparticle comprising:
   a core comprising indium, phosphorus, zinc, sulfur and an element selected from magnesium and aluminum;
   a first shell disposed on the core; and
   a second shell disposed on the first shell,
   wherein the quantum dot nanoparticle emits light in the green region of the visible spectrum.

2. The quantum dot nanoparticle of claim 1, wherein the first shell is ZnS.

3. The quantum dot nanoparticle of claim 1, wherein the second shell is ZnO.

4. The quantum dot nanoparticle of claim 1, wherein the element is magnesium.

5. The quantum dot nanoparticle of claim 4, wherein the quantum dot nanoparticle exhibits a quantum yield of at least about 74%.

6. The quantum dot nanoparticle of claim 4, wherein the emitted light has an emission maximum of about 521-523 nm with a full-width at half-maximum (FWHM) of about 48-57 nm.

7. The quantum dot nanoparticle of claim 1, wherein the element is aluminum.

8. The quantum dot nanoparticle of claim 7, wherein the quantum dot nanoparticle exhibits a quantum yield of at least about 82%.

9. The quantum dot nanoparticle of claim 7, wherein the emitted light has an emission maximum of about 526 nm with a full-width at half-maximum (FWHM) of about 47 nm.

10. A quantum dot nanoparticle comprising:
   a core comprising indium, phosphorus, zinc, sulfur and calcium;
   a first shell disposed on the core; and
   a second shell disposed on the first shell,
   wherein the quantum dot nanoparticle emits light in the green region of the visible spectrum.

11. The quantum dot nanoparticle of claim 10, wherein the first shell is an alloyed $ZnSe_{1-x}S_x$ shell, where $0 \leq x \leq 1$, and x increases from 0 to 1 from the core to outer surface of the shell).

12. The quantum dot nanoparticle of claim 11, wherein the alloyed $ZnSe_{1-x}S_x$ shell first shell has a gradient structure, and x increases from 0 to 1 from the core to outer surface of the first shell.

13. The quantum dot nanoparticle of claim 10, wherein the second shell is ZnO.

14. The quantum dot nanoparticle of claim 10, wherein the quantum dot nanoparticle exhibits a quantum yield of at least about 83%.

15. The quantum dot nanoparticle of claim 10, wherein the emitted light has an emission maximum of about 528 nm with a full-width at half-maximum (FWHM) of about 46 nm.

* * * * *